US005763890A

United States Patent [19]

Cloutier et al.

[11] Patent Number: 5,763,890

[45] Date of Patent: Jun. 9, 1998

[54] CATHODE MOUNTING FOR ION SOURCE WITH INDIRECTLY HEATED CATHODE

[75] Inventors: Richard M. Cloutier, Salisbury; Thomas N. Horsky, Boxborough; William E. Reynolds, Topsfield, all of Mass.

[73] Assignee: Eaton Corporation, Cleveland, Ohio

[21] Appl. No.: 740,478

[22] Filed: Oct. 30, 1996

[51] Int. Cl.$^6$ .................................................... H01J 37/08

[52] U.S. Cl. ................ 250/427; 250/423 R; 250/492.21

[58] Field of Search ............................... 250/423 R, 427, 250/424, 492.21; 313/362.1; 315/111.81

[56] References Cited

U.S. PATENT DOCUMENTS

| | | | |
|---|---|---|---|
| 4,641,031 | 2/1987 | Ito et al. | 250/423 R |
| 4,672,210 | 6/1987 | Armstrong et al. | 250/492.2 |
| 5,026,997 | 6/1991 | Benveniste | 250/492.2 |
| 5,262,652 | 11/1993 | Bright et al. | 250/492.2 |
| 5,420,415 | 5/1995 | Trueira | 250/492.21 |
| 5,497,006 | 3/1996 | Sferlazzo et al. | 250/427 |
| 5,554,852 | 9/1996 | Bright et al. | 250/423 R |

*Primary Examiner*—Kiet T. Nguyen

*Attorney, Agent, or Firm*—Watts, Hoffmann, Fisher & Heinke, Co., L.P.A.

[57] ABSTRACT

An ion source is for use in an ion implanter. The ion source comprises a gas confinement chamber having conductive chamber walls that bound a gas ionization zone. The gas confinement chamber includes an exit opening to allow ions to exit the chamber. A base positions the gas confinement chamber relative to structure for forming an ion beam from ions exiting the gas confinement chamber.

10 Claims, 7 Drawing Sheets

CATHODE MOUNTING FOR ION SOURCE WITH INDIRECTLY HEATED CATHODE

FIELD OF THE INVENTION

The present invention relates to an ion implanter having an ion generating source that emits ions to form an ion beam for beam treatment of a workpiece.

BACKGROUND ART

Ion implanters have been used for treating silicon wafers by bombardment of the wafers with an ion beam. The ion beam dopes the wafers with impurities of controlled concentration to yield a semiconductor wafer that in turn is used to fabricate an integrated circuit. One important factor in such implanters is the throughput or number of wafers that can be treated in a given time.

High current ion implanters include a spinning disk support for moving multiple silicon wafers through the ion beam. The ion beam impacts the wafer surface as the support rotates the wafers through the ion beam.

Medium current implanters treat one wafer at a time. The wafers are supported in a cassette and are withdrawn one at time and placed on a platen. The wafer is then oriented in an implantation orientation so that the ion beam strikes the single wafer. These medium current implanters use beam shaping electronics to deflect a relatively narrow beam from its initial trajectory to selectively dope or treat the entire wafer surface.

Ion sources that generate the ion beams used in existing implanters typically include heated filament cathodes that tend to degrade with use. After relatively short periods of use, the filament cathodes must be replaced so that ions can again be generated with sufficient efficiency. Maximizing the interval between filament cathode replacement increases the amount of time wafers are being implanted and, thus, increases the efficiency of the implanter.

U.S. Pat. No. 5,497,006 to Sferlazzo et al concerns an ion source having a cathode supported by a base and positioned with respect to a gas confinement chamber for ejecting ionizing electrons into the gas confinement chamber. The cathode of the '006 patent is a tubular conductive body and endcap that partially extends into the gas confinement chamber. A filament is supported within the tubular body and emits electrons that heat the endcap through electron bombardment, thermionically emitting the ionizing electrons into the gas confinement chamber.

DISCLOSURE OF THE INVENTION

The present invention is directed to an ion implanter using a new and improved ion generating source. The ion generating source of the present invention uses a cathode that shields a cathode filament from the plasma stream. The design of the cathode and filament allow easily and quick replacement or repair to reduce implanter downtime.

An ion source constructed in accordance with the present invention includes a gas confinement chamber having chamber walls that bound a gas ionization region and includes an exit opening to allow ions to exit the gas confinement chamber. A gas delivery system delivers an ionizable gas into the gas confinement chamber. A base supports the gas confinement chamber in a position relative to structure for forming an ion beam as ions exit the gas confinement chamber.

A cathode is positioned with respect to the ionization region of said gas confinement chamber to emit ionizing electrons into the ionization region of the gas confinement chamber. An insulator is attached to the gas confinement chamber for supporting the cathode and electrically insulating the cathode from the gas confinement chamber. The cathode includes a conductive cathode body that bounds an interior region and has an outer surface that extends into said gas confinement chamber interior. A filament is supported by the insulator at a position inside the interior region of the conductive body of said cathode for heating the conductive cathode body to cause ionizing electrons to be emitted from the body into said gas confinement chamber.

The insulator both aligns the cathode with respect to the gas confinement chamber but also allows the filament to be electrically isolated from the cathode body. The preferred insulator is a ceramic block constructed from alumina. This block includes an insulator body that defines notches that extend inwardly from exposed surfaces of the insulator body to impede coating of the exposed surfaces by material emitted by the source during operation of the ion source. This insulator design has decreased source failure due to deposition of conductive materials onto the insulator.

Further features of the present invention will become apparent to those skilled in the art to which the present invention relates from reading the following specification with reference to the accompanying drawings.

BEST MODE FOR PRACTICING THE INVENTION

Figure 1:
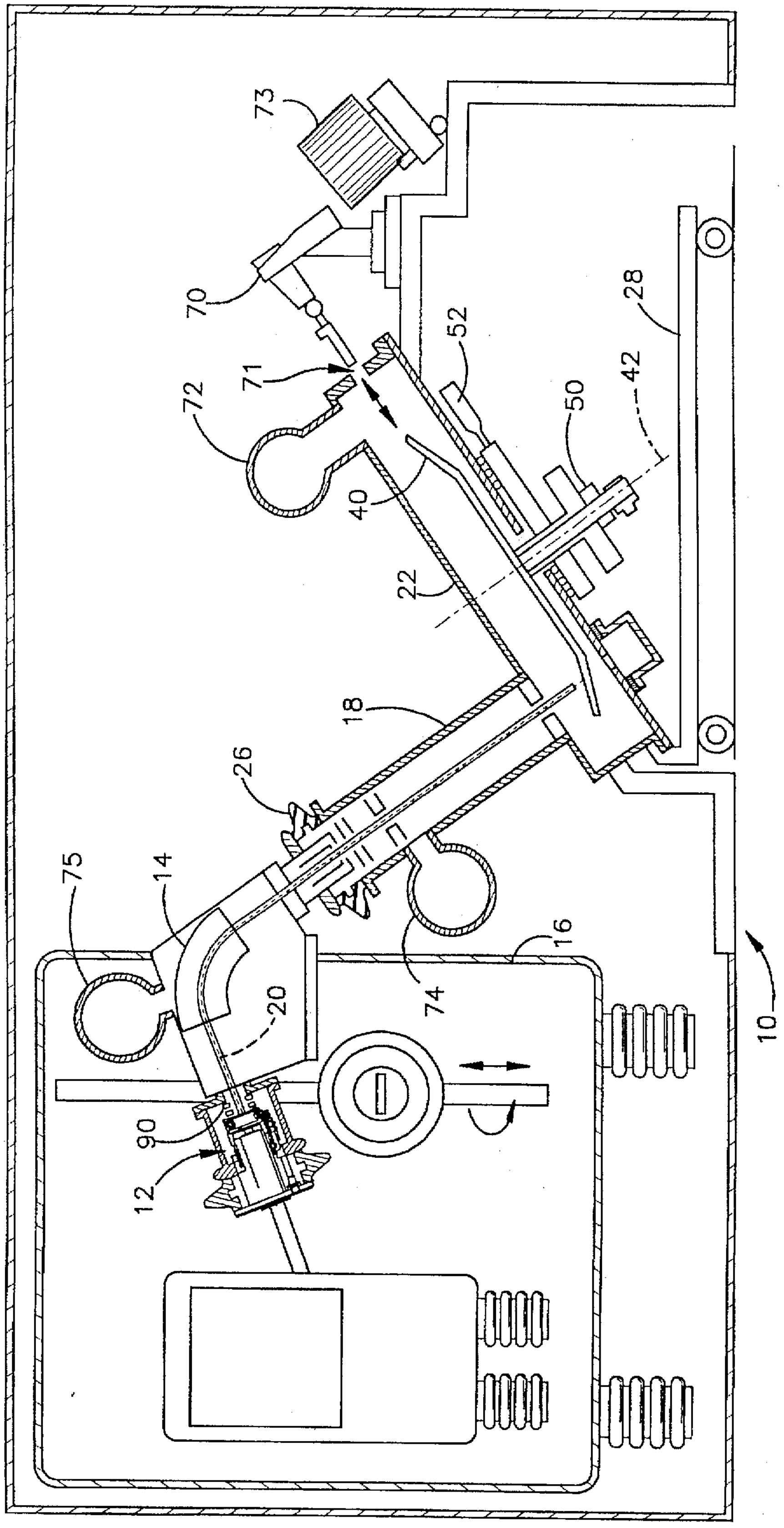
FIG. 1 is schematic view of an ion implanter for ion beam treatment of a workpiece such as a silicon wafer mounted on a spinning support.

FIG. 1 illustrates an ion implantation system 10 having an ion generating source 12 that embodies the present invention and a beam analyzing magnet 14 supported by a high-voltage housing 16. An ion beam 20 emanating from the source 12 follows a controlled travel path that exits the housing 16 travels through an evacuated tube 18 and enters an ion implantation chamber 22. Along the travel path of the ion beam 20 from the source 12 to the implantation chamber 22, the beam is shaped, filtered, and accelerated to a desired implantation energy.

The analyzing magnet 14 causes only those ions having an appropriate mass to charge ratio to reach the ion implantation chamber 22. In the region that the ion beam 20 exits the housing 16, the beam passes through a high-voltage isolation bushing 26 constructed from an electric insulating material that isolates the high-voltage housing 16 from the implantation chamber 22.

The ion implantation chamber 22 is supported on a movable pedestal 28 that allows the implantation chamber to be aligned relative to the ion beam 20. The ion beam 20 impinges upon one or more silicon wafers supported on a wafer support 40 which is mounted for rotation about an axis 42. The wafer support 40 supports multiple silicon wafers around its outer periphery and moves those wafers along a circular path. The ion beam 20 impacts each of the wafers and selectively dopes those wafers with ion impurities. High-speed rotation of the wafer support 40 is effected by a motor 50 which rotates the support 40 and wafers. A linear drive 52 causes the support 40 to be indexed back and forth within the chamber 22. The support 40 is positioned so that untreated wafers can be moved into the chamber 22 and treated wafers withdrawn from the chamber. Additional details concerning prior art ion implantation systems are contained in U.S. Pat. No. 4,672,210 to Armstrong et al. and assigned to the assignee of the present invention, the subject matter of which is incorporated herein by reference.

Silicon wafers are inserted into the ion implantation chamber 22 by a robotic arm 70 through a vacuum port 71. The chamber 22 is evacuated by a vacuum pump 72 to a low pressure equal to the pressure along the evacuated tube 18. The robotic arm 70 transfers wafers back and forth between a cassette 73 for storing the wafers. Mechanisms for accomplishing this transfer are well known in the prior art. Additional vacuum pumps 74, 75 evacuate the ion beam path from the source 12 to the implantation chamber 22.

Figure 2:
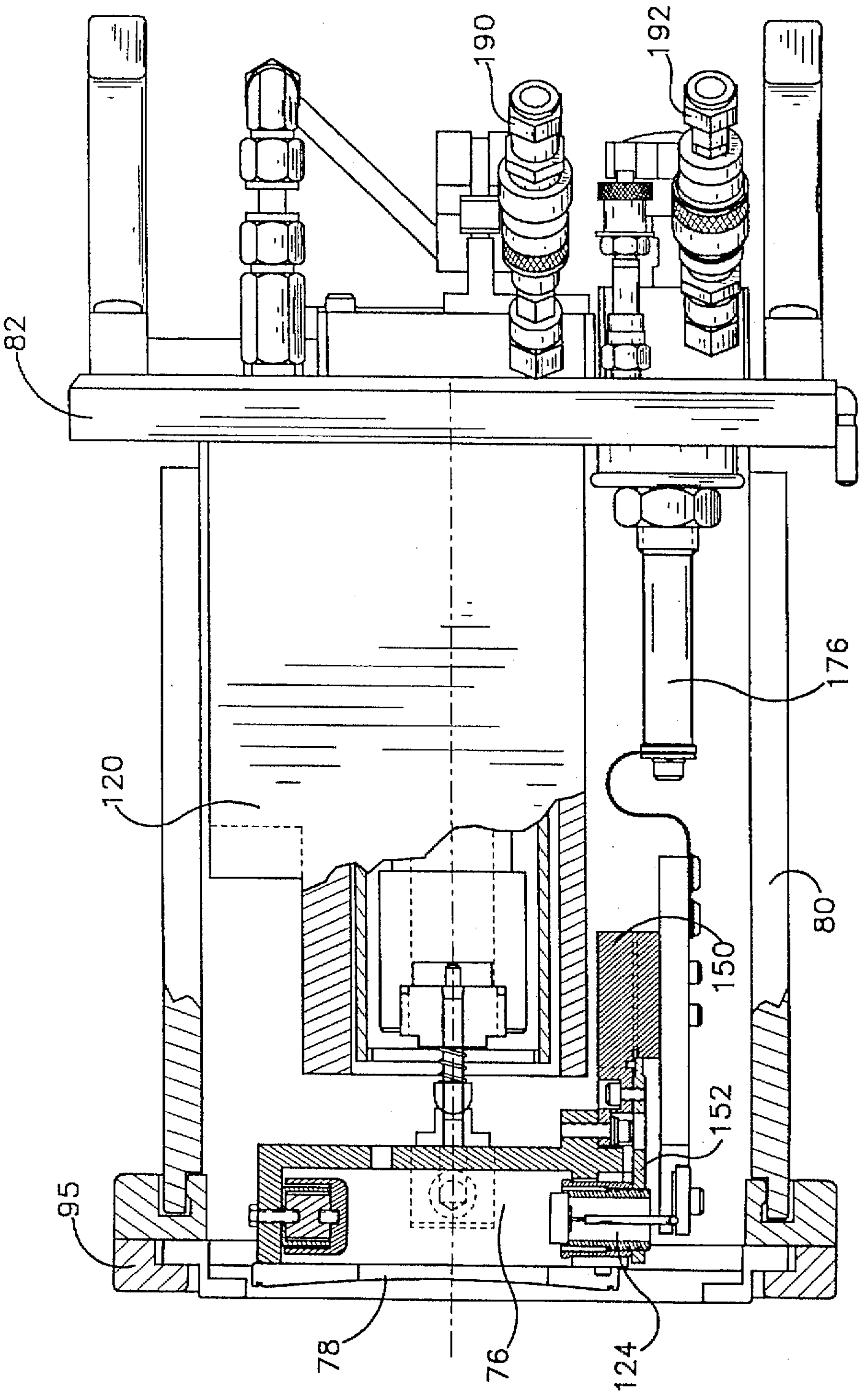
FIG. 2 is a partial cross-sectional view of an ion generating source embodying the present invention for creating an ion beam in the implanter of FIG. 1.
Figure 4:
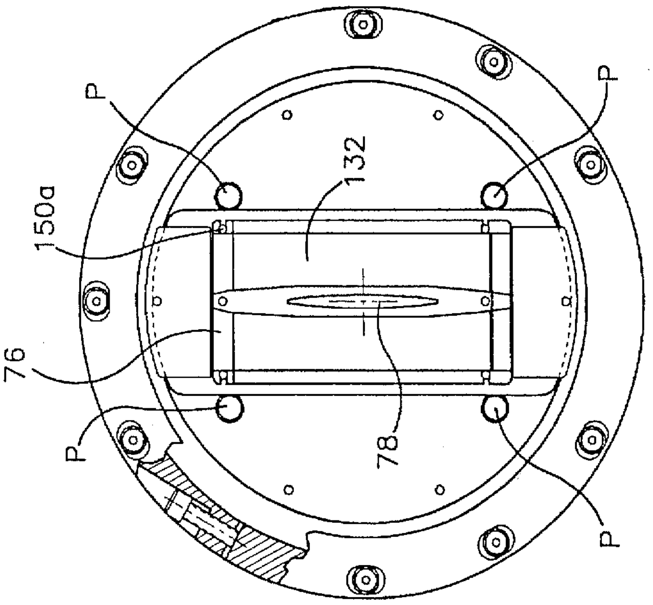
FIG. 4 is an elevation view of the ion generating source showing an arc slit through which ions exit the ion source.
Figure 3:
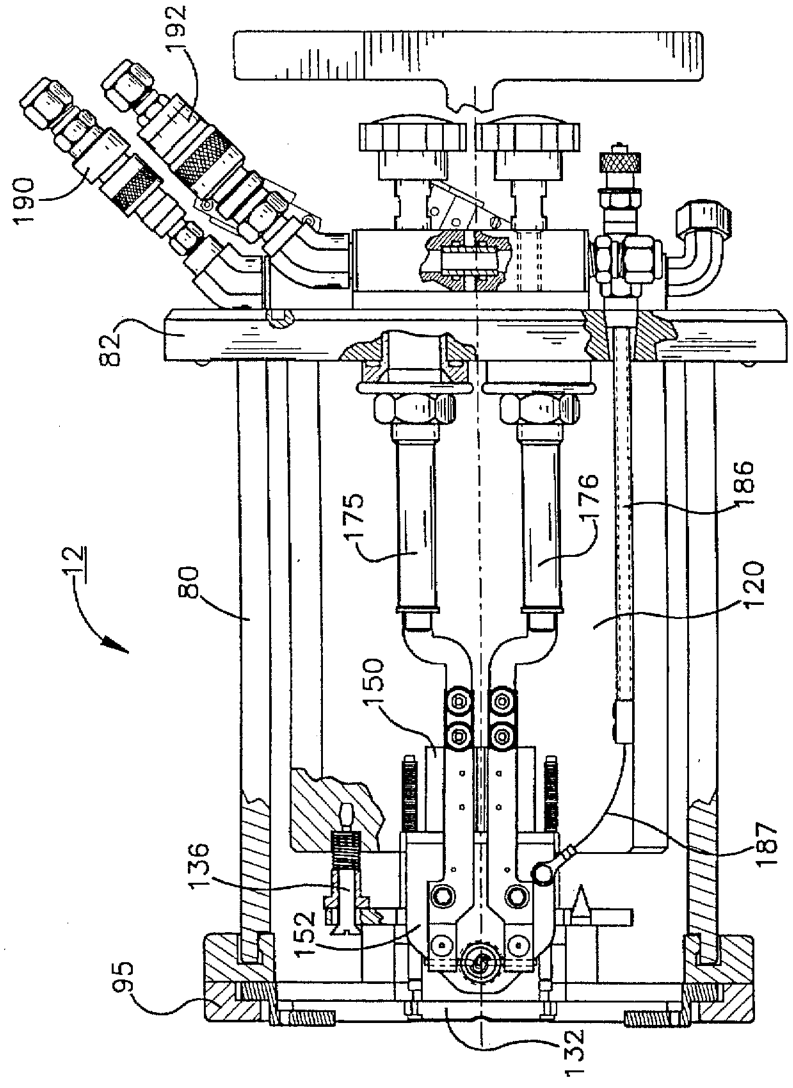
FIG. 3 is a plan view of the ion generating source showing an electrical connection for energizing a shielded filament that forms part of the source cathode.
Figure 5:
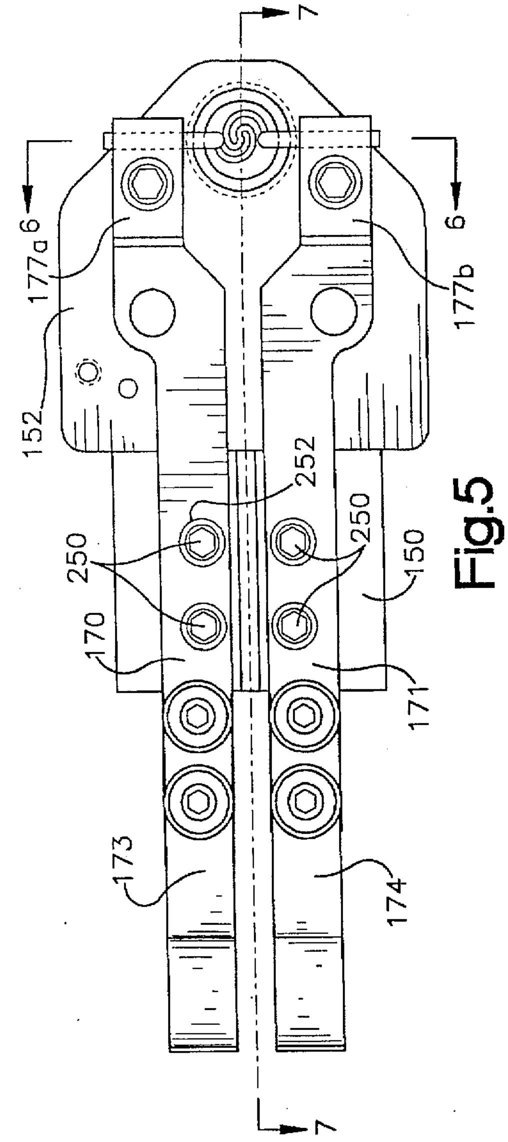
FIG. 5 is an enlarged plan view of structure for mounting a source cathode.

The source 12 includes a high-density plasma arc chamber 76 (FIG. 2) having an elongated, generally elliptically shaped exit aperture 78 in its front wall through which ions exit the source (FIG. 4). The arc chamber 76 is positioned relative the ion beam path by a generally cylindrical source housing 80 mounted to a flange 82 supported within the high voltage housing 16. Additional details concerning one prior art ion source are disclosed in U.S. Pat. No. 5,026,997 to Benveniste et al. assigned to the assignee of the present invention and which is incorporated herein by reference. As ions migrate from the plasma chamber 76, they are accelerated away from the chamber 76 by electric fields set up by extraction electrodes 90 (FIG. 1) positioned just outside the exit aperture. The analyzing magnet 14 produces a magnetic field that bends ions having the correct mass to an implant trajectory. These ions exit the analyzing magnet 14 and are accelerated along a travel path leading to the implantation chamber 22. An implanter controller is located within the high-voltage housing 16 and adjusts the field strength of the analyzing magnet 14 by controlling current in the magnet's field windings.

The source 12 produces a large fraction of ions having a mass different from the ions used for implantation. These unwanted ions are also bent by the analyzing magnet 14 but are separated from the implantation trajectory. Heavy ions follow a large radius trajectory, for example, and ions that are lighter than those used for implantation follow a tighter radius trajectory.

Ion Source

The ion generating source 12 (FIGS. 2–5) embodying the present invention includes a source block 120 supported by the flange 82. The source block in turn supports the plasma arc chamber 76 and an electron emitting cathode 124 that in the preferred embodiment of the present invention is supported by but electrically isolated from the arc chamber 76.

A source magnet (Not Shown) encircles the plasma arc chamber 76 (FIGS. 14–18) to confine the plasma generating electrons to tightly constrained travel paths within the chamber 76. The source block 120 also defines cavities that accommodate vaporizer ovens 122, 123 that can be filled with vaporizable solids such as arsenic that are vaporized to a gas and then injected into the plasma chamber 76 by means of delivery nozzles 126, 128. The plasma arc chamber 76 is an elongated metal casting which defines an interior ionization region R bounded by two elongated side walls **130*a*, 130*b* top and bottom walls 130*c*, 130*d* and a front wall defining plate 132 that abuts the ionization region R. Extending outwardly from its two side walls 130*a*, 130*b* the arc chamber includes a support flange 134** for mounting the arc chamber.

The plate 132 is aligned relative to the source housing 80. As described in U.S. Pat. No. 5,420,415 to Trueira, which is incorporated herein by reference, the plate 132 is attached to an aligning fixture 95 that attaches to the housing 80. Briefly, the alignment fixture 95 is inserted into the source housing such that the plane of the fixture is perpendicular to the ion beam axis. Once in position the ion source couples to the alignment fixture by being captured on bullet head pins P (FIG. 4) attached to the alignment fixture.

Four elongated bolts 136 threaded at their ends pass through four openings 138 in the flange 134 and engage threaded openings 140 in the source block 120. The bolts 136 pass through bushings 146 and springs 148 that bias the arc chamber 78 away from the source block 120 to facilitate capture of the arc chamber by the alignment fixture 95.

Figure 8:
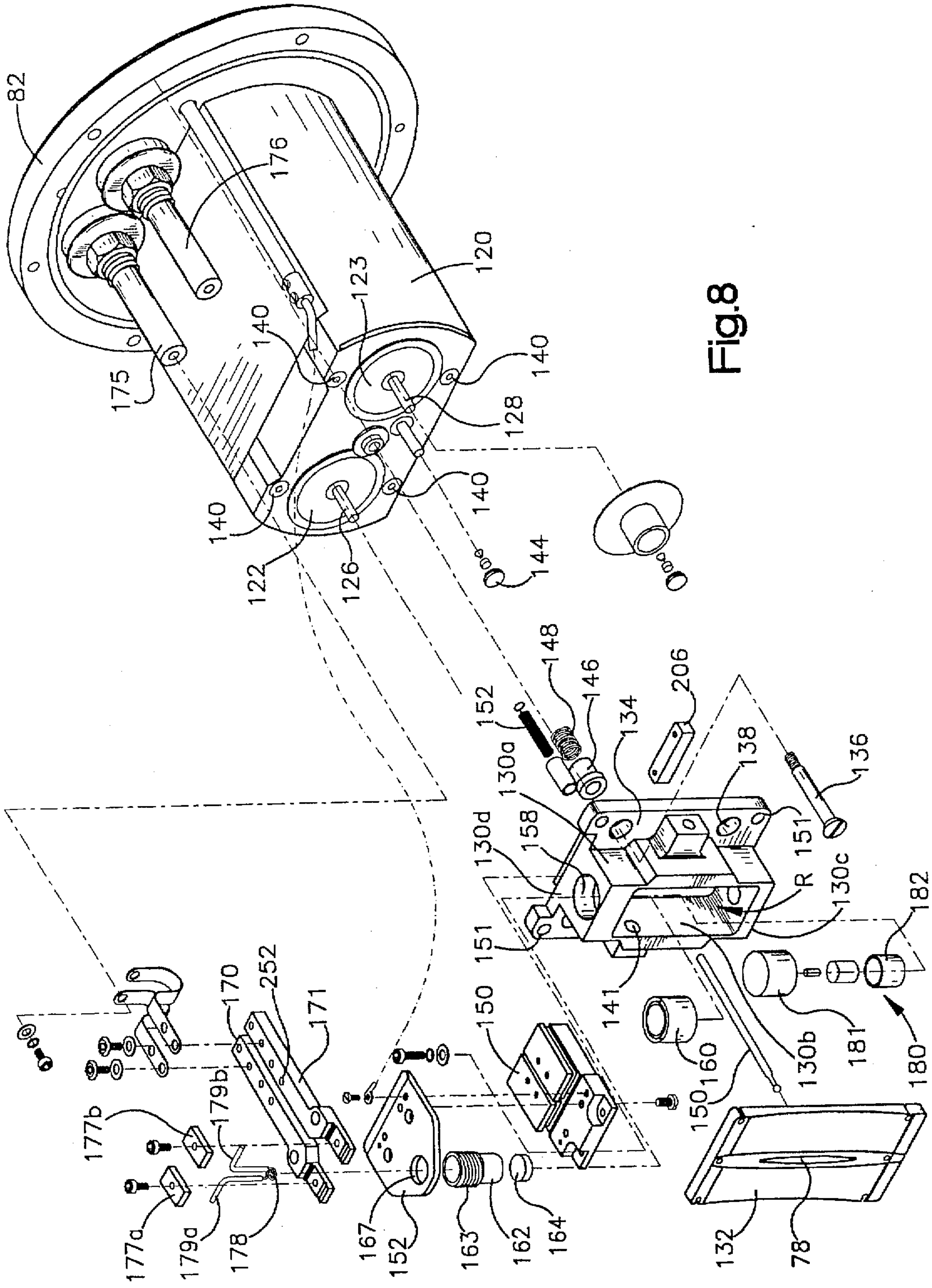
FIG. 8 is an exploded perspective view of an ion source constructed in accordance with the invention.
Figure 9:
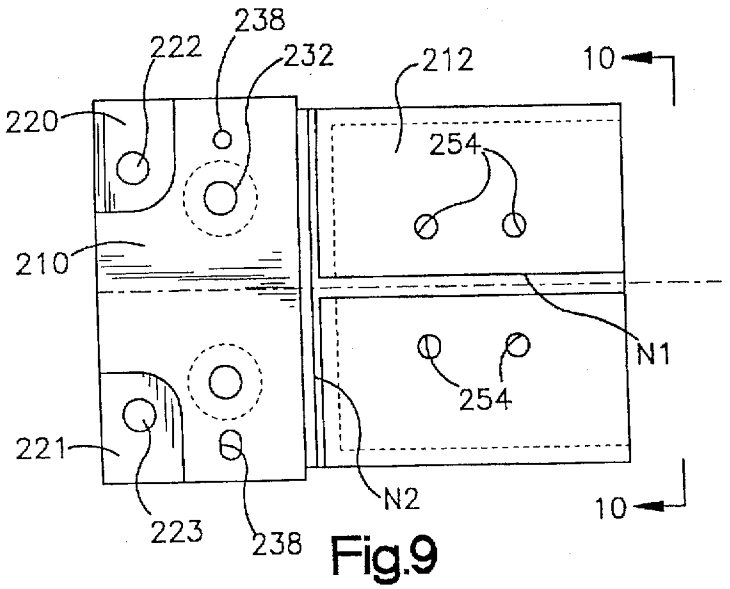
FIG. 9 is a top plan view of an insulating block used to electrically isolate a source cathode from an ion plasma chamber.
Figure 10:
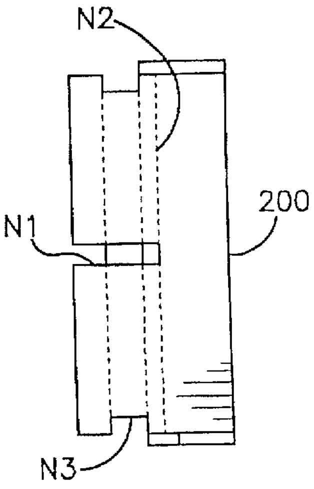
FIG. 10 is a view from the plane 10—10 of FIG. 9.
Figure 11:
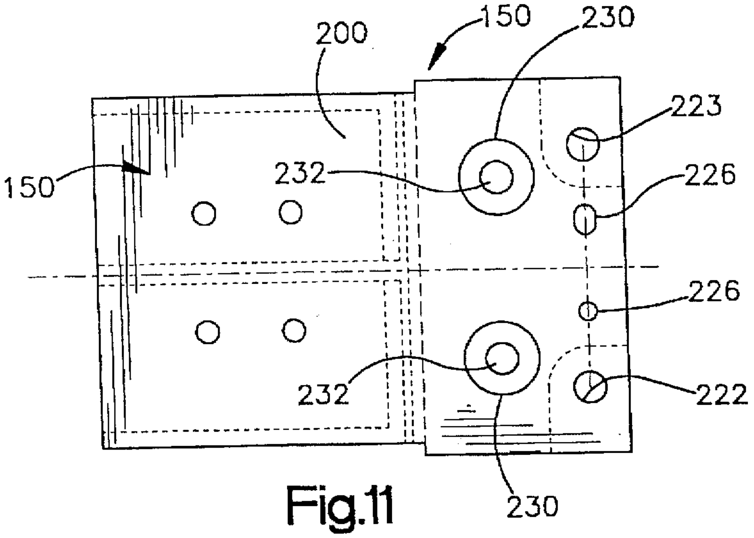
FIG. 11 is a bottom plan view of the insulating block shown in FIG. 9.

Four pins 150 (only one of which is seen in FIG. 8) extend through openings 151 in the four corners of the arc chamber's flange 132. These pins are spring biased away from the source block 120 by means of springs 152. Slightly enlarged ends **150*a* of the pins fit within the plate 132 and keep the plate and arc housing 76** connected together.

Vaporized material is injected into the interior of the plasma arc chamber 76 from the support block 120 by the delivery nozzles 126, 128. On opposite sides of the chamber 76 passageways 141 extend from a rear of the chamber 76 through a chamber body and open into the interior of the plasma arc chamber 76. Additionally, gas can be directly routed into the chamber 76 by means of a port or opening 142 in a rear wall **130*e* of the chamber. A nozzle 144 abuts the opening 142 and injects gas directly into the arc chamber 76** from a source or supply external to the ion source.

The wall 130*d* defines an opening 158 sized to allow the cathode 124 to extend into an interior of the plasma arc chamber 76 without touching the chamber wall 130*d* that defines the opening 158. The cathode 124 is supported by an insulating mounting block 150 that is attached the rear of the arc chamber. A cathode body that fits into the opening 158 is mounted to a metal mounting plate 152 supported by the insulating mounting block 150.

The cathode body is constructed from three metallic members 160, 162, 164. An outer tubular member 160 of the cathode 124 is made from a molybdenum alloy material. A lower end 161 of the tubular member 160 that abuts the mounting plate 152. An inner tubular member 162 is also made from a molybdenum alloy material and has a threaded lower end portion 163. The threaded end portion 163 of the inner tubular member 162 is threaded into a threaded opening 167 in the mounting plate 152. The tubular members 160, 162 are preferably cylindrical.

Figure 13:
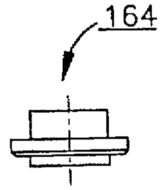
FIG. 13 is a side elevation view of a cathode cap that emits ionizing electrons into an arc chamber interior during operation of the ion source.
Figure 12:
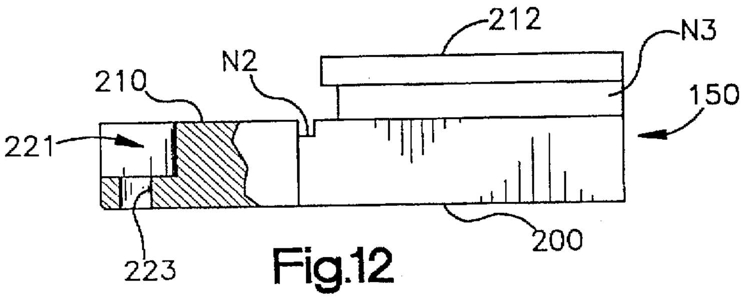
FIG. 12 is a partially sectioned side elevation view of the insulating block shown in FIG. 9.
Figure 14:
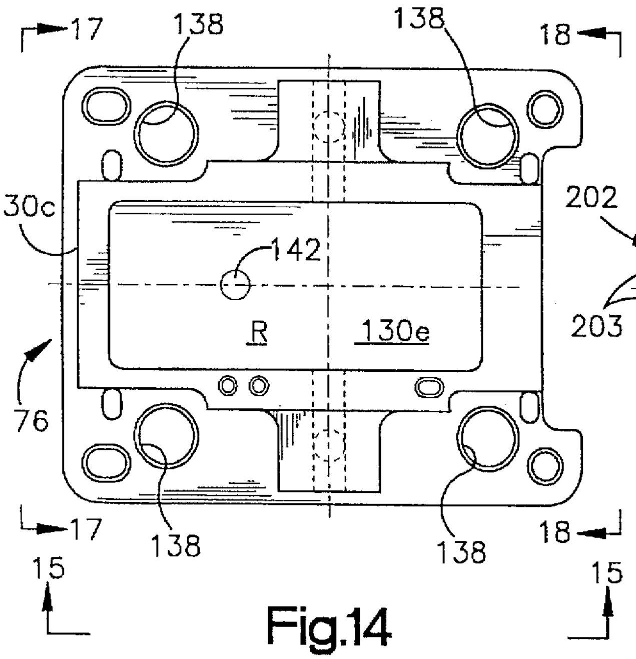
FIG. 14 is a front elevation view of an ion source arc chamber.
Figure 17:
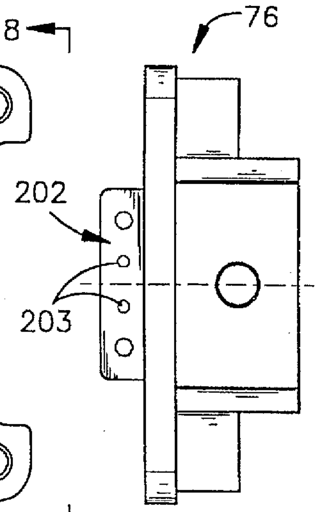
FIG. 17 is a view of the arc chamber as seen from the plane 17—17 of FIG. 14.
Figure 18:
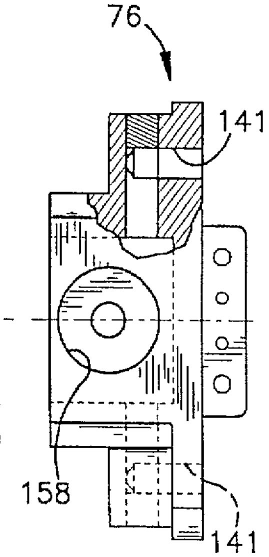
FIG. 18 is a view of the arc chamber as seen from the plane 18—18 of FIG. 14.
Figure 15:
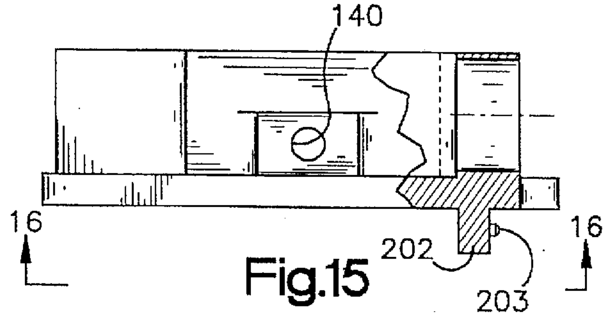
FIG. 15 is a view of the arc chamber as seen from the plane 15—15 of FIG. 14.
Figure 16:
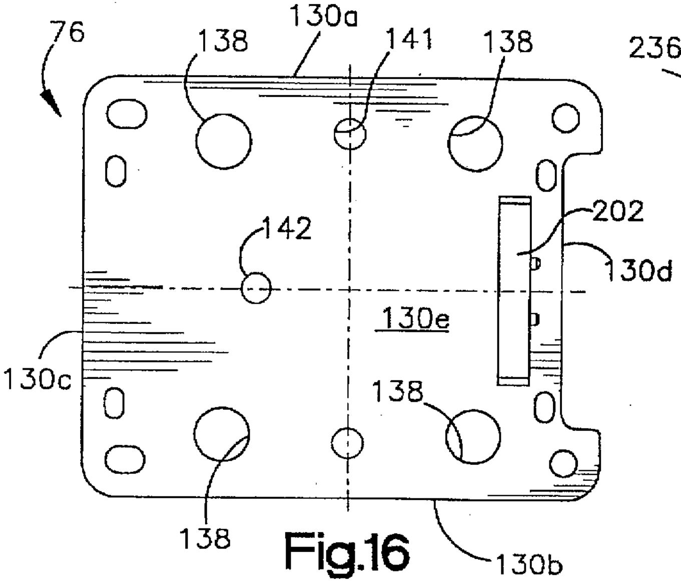
FIG. 16 is a view of the arc chamber as seen from the plane 16—16 of FIG. 15.
Figure 19:
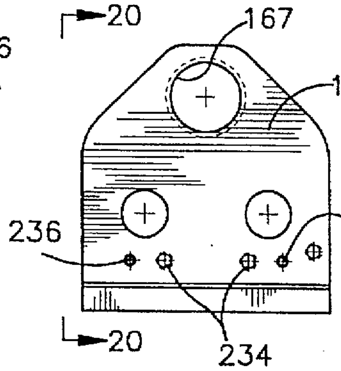
FIG. 19 is a plan view of a mounting plate for mounting a cathode body for positioning within the arc chamber.
Figure 20:
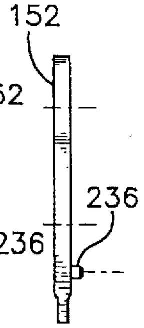
FIG. 20 is a view of the mounting plate as seen from the line 20—20 in FIG. 19.

An end cap 164 (FIG. 13) of the cathode 124 is conductive and is made from a tungsten material. The cap 164 fits within a counterbore of an end of the tubular members 162. The counterbore has an inwardly extending ridge having an inner diameter slightly smaller than the diameter of the cap 164. During assembly of the cathode 124 the cap is press fit into the tubular member 162 and frictionally held in place during operation of the ion implanter 10. The length of the inner and outer tubular members 160, 162 is selected so that the cap 164 extends upward into the arc chamber 76 beyond the end of the outer tubular member 160.

Two conductive mounting arms 170, 171 support a filament 178 inside the cathode 124. The arms 170, 171 are attached directly to the insulating block 150 by connectors 172 that pass through the arms to engage threaded openings in the block 150. Conductive energizing bands 173, 174 are coupled to the filament and energized by signals routed through the flange 82 of the housing 80 via power feedthroughs 175, 176.

Two clamps 177*a*, 177*b* fix a tungsten filament 178 within a cavity C defined by the innermost tubular member 162 of the cathode. The filament 178 is made of a tungsten wire bent to form a helical loop (See FIG. 5). Ends of the filament 178 are supported by first and second tantalum legs 179*a*, 179*b* held in electrical contact with the two arms 170, 171 by the clamps 177*a*, 177*b*.

When the tungsten wire filament 178 is energized by application of a potential difference across the power feedthroughs 175, 176 the filaments emit electrons which accelerate toward and impact the cap 164 of the cathode 124. When the cap 164 is sufficiently heated by electron bombardment, it in turn emits electrons into the arc chamber 76 which strike gas molecules and create ions within the chamber 76. An ion plasma is created and ions within this plasma exit the opening 78 to form the ion beam. The cap 164 shields the filament from contact with the ion plasma within the chamber and extends the life of the filament. Additionally, the manner in which the filament is supported facilitates replacement of the filament.

Electrons generated by the cathode 124 that are emitted into the arc chamber 76 but which do not engage a gas molecule within a gas ionization zone move to the vicinity of a repeller 180. The repeller 180 includes a metal member 181 located within the arc chamber 76 which deflects electrons back into the gas ionization zone to contact a gas molecule. The metal member 181 is made of molybdenum. A ceramic insulator 182 insulates the repeller member 181 from the electrical potential of the lower wall 130*c* of the plasma arc chamber 76. The cathode 124 and repeller 180 are therefore electrically and thermally isolated from the arc chamber walls. Shorting of the repeller member 181 is impeded by a metal cup 184 that prevents ions from coating the insulator 182.

The walls of the chamber 76 are held at a local ground or reference electric potential. The cathode, including the cathode end cap 164 is held at a potential of between 50–150 volts below the local ground of the chamber walls. This electric potential is coupled to the plate 152 by a power feedthrough 186 for attaching an electrical conductor 187 to the plate 152 that supports the cathode. The filament 178 is held at a voltage of between 200 and 600 volts below that of the end cap 164. The large voltage difference between the filament and the cathode imparts a high energy to the electrons leaving the filament that is sufficient to heat the end cap 164 and thermionically emit electrons into the chamber 76. The repeller member 181 is allowed to float at the electrical potential of the gas plasma within the chamber 76.

The '006 patent to Sferlazzo et al depicts a schematic of a circuit that controls arc current between the cathode and the anode (chamber walls of the arc chamber). The operation of this circuit is described in the Sferlazzo et al patent and is also incorporated herein. During generation of ions, the source heats up due to the injection of ionizing energy into the arc chamber. Not all of this energy ionizes the gas within the arc chamber and a certain amount of heat is generated. The chamber includes water couplings 190, 192 that route cooling water into the source block and route heated water away from the region of the arc chamber.

Insulating Block 150

In addition to insulating the cathode from the arc chamber the insulating block 150 positions the filament 178 with respect to the cathode body and the cathode body with respect to the arc chamber. FIGS. 9–12 depict the insulating block 150 in greater detail.

The insulating block 150 is an elongated ceramic electrically insulating block constructed from 99% pure alumina ($Al_2O_3$). The insulating block has a first generally flat surface 200 that extends the length and width of the insulating block. This surface 200 engages a cathode mounting flange 202 (FIG. 17) that extends from the rear wall 130*e* of the gas confinement chamber 76. On a side of the insulating block opposite the first surface 200, the insulating block 150 defines a generally planar cathode support surface 210 for supporting the cathode 124 and a second generally planar filament support surface 212 for supporting the cathode filament 178 in spaced relation to the cathode. As seen most clearly from the plan view of FIG. 9, the cathode support surface 210 has two corner notches 220, 221 having openings 222, 223 that extend through a reduced width of the insulating block defined by the notches.

Figure 7:
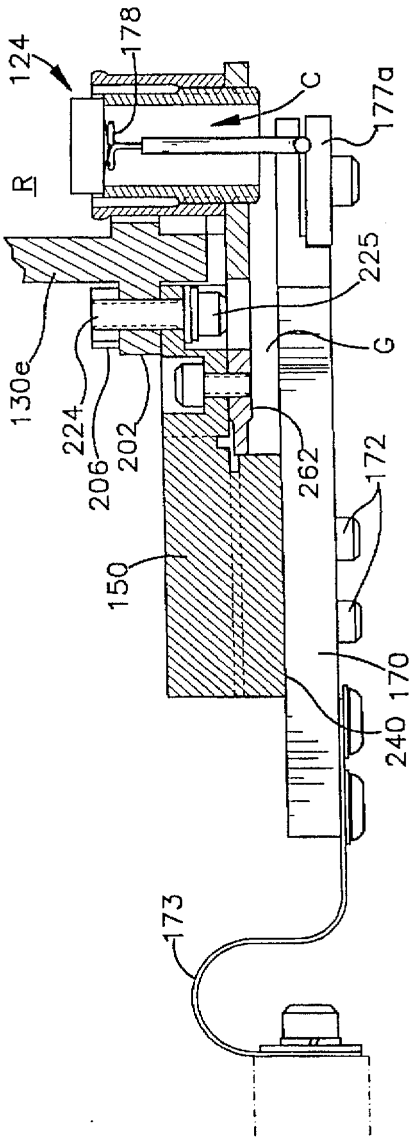
FIG. 7 is a view from the line 7—7 in FIG. 5.
Figure 6:
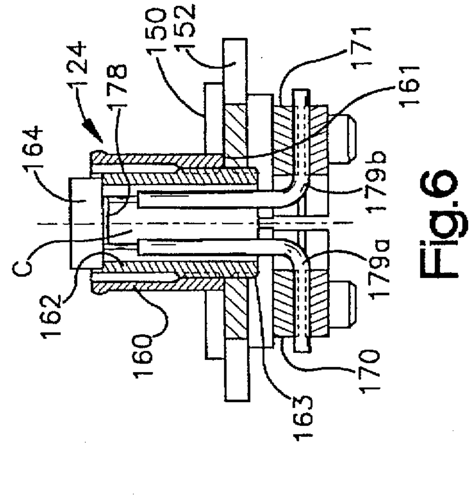
FIG. 6 is a view from the line 6—6 in FIG. 5.

Two connectors 224 having enlarged heads 225 extend through these openings 222, 223 and attach the insulating block to the flange 202 on the arc source chamber 76. The connectors 224 are threaded along their length. These connectors engage threaded openings 204 in the flange 202. A backing plate 206 (FIG. 7) also includes threaded openings into which the connectors extend to securely fasten the insulating block 150 to the arc chamber 78. When the insulating block 150 is attached to the arc chamber the first generally flat surface 200 extends at a generally perpendicular angle to the back wall 130*e* of the arc chamber. Two locating pins 203 extend away from a surface 202*a* of the flange 202. These pins fit into corresponding openings 226 that extend into the surface 200 of the insulator 150 to help align the insulating block 150 during installation.

As seen in the Figures the metal plate 152 that supports the three piece cathode body rests against the cathode support surface 210 of the block and extends away from that surface to bring the cathode body into alignment with the opening 158. Threaded connectors 228 extend into a two recessed wells 230 in the surface 200 of the insulating block 150 and pass through openings 232 in the block to engage threaded openings 234 in the plate 152.

Two locating pins 236 are carried by the plate 152. As the plate is attached to the insulating block 150 these pins extend into alignment holes 238 in the block 150. This helps align the block and plate and facilitates connection of the two during fabrication of the cathode as well as during maintenance of the cathode after use in the implanter 10.

Once the plate 152 is attached to the block 150 and the block attached to the arc chamber the threaded opening 167 in the plate 152 that positions the three piece cathode body is aligned with respect to the opening 158 that extends through the wall 130*d* in the arc chamber.

Planar surfaces 240 of the elongated legs 170, 171 engage and are supported by the insulating block surface 212 that is spaced from the surface 200 by a maximum thickness of the insulating block 150. Threaded connectors 250 having enlarged heads extend through openings 252 in the legs 170, 171 and thread into threaded openings 254 in the filament support surface 212. As seen most clearly in FIG. 7, the relative spacing between the two planar surfaces 210, 212 of the insulating block defines a gap G between the surface 240 of the legs 170, 171 and a surface 262 of the plate 152. This gap and the fact that the ceramic is made of an electrically insulating material electrically isolates the two legs not only from each other but from the plate 152 that supports the cathode body. The holes in the filament support legs 170, 171 align with the holes in the insulating body 150 and accurately position the filament 178 within the inside of the cathode body.

As seen in FIGS. 9–12, the ceramic insulating body of the insulator defines a number of elongated notches or channels N1–N3. These notches disrupt the generally planar surfaces of the insulating block 150. When mounted near the arc chamber, the insulating block is coated with ions. The insulators disclosed in U.S. Pat. No. 5,497,006 to Sferlazzo et al were subject to surface coating during operation of the source. This coating could lead to premature arc-over or shorting and failure of the source. The channels N1–N5 in the single block insulator 150 make the block self-shadowing i.e. the ions do not coat a continuous surface across the insulating block and are therefore less prone to arc over.

Cathode Cap 164

The cathode cap 164 is a machined tungsten thermionic emitter that provides arc current to the arc chamber. The simple disk shaped cap disclosed in U.S. Pat. No. 5,497,006 to Sferlazzo et al is replaced with a cap 164 compatible with the cathode structure shown in the '006 patent.

The cap 164 has a reduced diameter emitting surface 165 and a wider flange surface 166 that rests against an end of the inner tubular member 162.

The cap 164 significantly reduces thermal load of the support including the insulating block 150. The cap also more efficiently utilizes filament heating power since less heating power is required to energize the filament 178 for a given arc chamber current. The cap allows higher arc currents to be achieved using the existing arc chamber controller electronics. Use of the cap has resulted in increased production efficiency of all ion species, particularly multiply charged ions. For singly-charged ion, efficiency is increased by a demonstrated increase in dissociation of molecular ions (e.g., dissociation of $BF_3$ and $BF_2$). The combination of higher electron current density (due to the reduced emission area) and higher emitter temperatures (due to smaller thermal mass and improved emitter thermal isolation) also results in higher fractions of multiply-charged ions.

From the above description of a preferred embodiment of the invention, those skilled in the art will perceive improvements, changes and modifications. Such improvements, changes and modifications within the skill of the art are intended to be covered by the appended claims.

Having described a preferred embodiment of the invention, we claim:

1. An ion source for use in an ion implanter, said ion source comprising:

a) a gas confinement chamber having chamber walls that bound a gas ionization region and including an exit opening to allow ions to exit the gas confinement chamber wherein one chamber wall includes a flange that extends from said one chamber wall;

b) a gas delivery system for delivering an ionizable gas into the gas confinement chamber;

c) a base for supporting the gas confinement chamber in a position relative to structure for forming an ion beam from said ions exiting said gas confinement chamber;

d) a cathode positioned with respect to the ionization region of said gas confinement chamber to emit ionizing electrons into the ionization region of the gas confinement chamber to ionize gas molecules; and e) an insulator having a first generally flat surface attached to the flange of the gas confinement chamber wall for supporting the cathode and electrically insulating the cathode from the gas confinement chamber;

f) said cathode comprising a conductive cathode body that bounds an interior region and has an outer surface that extends into said gas confinement chamber interior and a filament supported by said insulator at a position inside the interior region of the conductive body of said cathode for heating said body and thereby cause said ionizing electrons to be emitted from the body into said gas confinement chamber.

2. The ion source of claim 1 wherein the insulator is constructed from a ceramic insulating material.

3. The ion source of claim 1 wherein the insulator includes a support body having a first generally planar cathode support surface for supporting the cathode body and a second generally planar filament support surface for supporting said filament in spaced relation to the cathode body while maintaining electrical isolation between said filament and said cathode body.

4. The ion source of claim 3 additionally comprising first and second mounting legs that engage the filament support surface of the insulating block.

5. The ion source of claim 3 wherein the cathode is connected to a generally planar mounting plate that engages the first generally planar cathode support surface of the insulating block.

6. The ion source of claim 3 wherein the insulator body defines notches that extend inwardly from exposed surfaces of the insulator body to impede coating of said exposed surfaces by material emitted by the ion source during operation of the ion source.

7. The ion source of claim 3 wherein the gas confinement chamber includes a mounting flange having positioning rods that extend away from the mounting flange and wherein the insulating body defines alignment openings for engaging the positioning rods supported by the gas confinement chamber.

8. An ion generating source for use with an ion implanter, said ion generating source comprising:

a) a gas confinement chamber having conductive chamber walls that bound a gas ionization zone and including an exit opening to allow ions to exit the gas confinement chamber;

b) a support for positioning said gas confinement chamber relative to structure for forming an ion beam from said ions exiting said gas confinement chamber;

c) a gas delivery system in communication with said gas confinement chamber for delivering an ionizable material into the gas confinement chamber;

d) a cathode for emitting ionizing electrons into the gas ionization zone defined by the gas confinement chamber, said cathode comprising a tubular conductive body that partially extends into said gas confinement chamber interior and includes a conductive cap that faces into the gas confinement chamber for emitting said ionizing electrons into the gas confinement chamber;

e) an electric insulator connected to said gas confinement chamber for supporting said tubular conductive body of the cathode in a spaced relation to the conductive chamber walls of said gas confinement chamber; and f) a filament supported by said insulator at a position inside the tubular conductive body of said cathode for heating the conductive cap and causing the ionizing electrons to be emitted from the conductive cap into said gas confinement chamber;

said insulator including an insulator body defining a planar cathode support region for supporting the cathode body and a planar filament support region spaced from said planar cathode support region for supporting the filament in spaced relation to the cathode body while maintaining electrical isolation between said filament and said cathode body.

9. The ion generating source of claim 8 wherein the gas confinement chamber includes an opening in one wall for insertion of the tubular conductive body into the confinement chamber and wherein the electric insulator supports the tubular conductive body in spaced relation to the wall of the chamber.

10. An improved cathode structure for use with an ion source for generating a beam of ions comprising:

a cathode for positioning with respect to a gas confinement chamber to emit ionizing electrons into a gas ionization zone of the gas confinement chamber, said cathode comprising a tubular conductive body and a conductive cap supported by the tubular conductive body for emitting said ionizing electrons into the gas confinement chamber;

a filament supported at a position inside the tubular conductive body of said cathode for heating said conductive cap and cause the ionizing electrons to be emitted from the cap into said gas confinement chamber; and an electric insulator connected to said gas confinement chamber for positioning the cathode with respect to the confinement chamber and for supporting said cathode and said filament in a spaced relation to each other and with respect to the conductive chamber walls of said gas confinement chamber;

said electric insulator comprising an insulator block having a first generally planar cathode support surface for supporting the cathode body and a second generally planar filament support surface spaced from said first generally planar cathode support surface for supporting said filament in spaced relation to the cathode body while maintaining electrical isolation between said filament and said cathode body.

* * * * *